(12) United States Patent
Wu et al.

(10) Patent No.: US 12,289,112 B2
(45) Date of Patent: Apr. 29, 2025

(54) PHASE-LOCKED LOOP DEVICE

(71) Applicant: Montage LZ Technologies (Shanghai) Co., Ltd., Shanghai (CN)

(72) Inventors: Shunfang Wu, Shanghai (CN); Qingxiang Dong, Shanghai (CN); Xiaomin Si, Shanghai (CN)

(73) Assignee: Montage LZ Technologies (Shanghai) Co., Ltd., Shanghai (CN)

( * ) Notice: Subject to any disclaimer, the term of this patent is extended or adjusted under 35 U.S.C. 154(b) by 68 days.

(21) Appl. No.: 18/501,024

(22) Filed: Nov. 2, 2023

(65) Prior Publication Data
US 2024/0223193 A1  Jul. 4, 2024

(30) Foreign Application Priority Data
Dec. 29, 2022 (CN) .......................... 202211716788.7

(51) Int. Cl.
*H03L 7/081* (2006.01)
*H03L 7/087* (2006.01)
*H03L 7/089* (2006.01)

(52) U.S. Cl.
CPC .............. *H03L 7/081* (2013.01); *H03L 7/087* (2013.01); *H03L 7/0895* (2013.01)

(58) Field of Classification Search
CPC . H03L 7/087; H03L 7/085; H03L 7/06; H03L 7/08; H03L 7/091
See application file for complete search history.

(56) References Cited

U.S. PATENT DOCUMENTS

| | | | | |
|---|---|---|---|---|
| 7,737,743 B1* | 6/2010 | Gao | .................. | H03L 7/113 |
| | | | | 327/158 |
| 8,395,427 B1* | 3/2013 | Gao | .................. | H03L 7/091 |
| | | | | 327/147 |
| 12,028,082 B2* | 7/2024 | Lee | .................. | H03L 7/087 |

OTHER PUBLICATIONS

Xiang Gao et al., "A Low Noise Sub-Sampling PLL in Which Divider Noise is Eliminated and PD/CP Noise is Not Multiplied by N2", IEEE Journal of Solid-State Circuits, Dec. 2009, pp. 3253-3263, vol. 44, No. 12.

Chun-Wei Hsu et al., "A Sub-Sampling-Assisted Phase-Frequency Detector for Low-Noise PLLs With Robust Operation Under Supply Interference", IEEE Transactions on Circuits and Systems-I: Regular Papers, Jan. 2015, pp. 90-99, vol. 62, No. 1.

* cited by examiner

*Primary Examiner* — Diana J. Cheng
(74) *Attorney, Agent, or Firm* — JCIPRNET

(57) ABSTRACT

Disclosed is a phase-locked loop device. The phase-locked loop device includes a frequency-locked loop circuit and a phase-locked loop circuit. The frequency-locked loop circuit includes a delay generator circuit and a frequency-phase detector. The delay generator circuit generates a ramp signal based on the feedback clock signal, and compares the ramp signal with multiple reference voltages to generate multiple delayed feedback clock signals. The frequency-phase detector has a dead zone control mechanism that generates a locking signal based on phases of the reference clock signal and delayed feedback clock signal and automatically switches on/off the dead zone. The phase-locked loop circuit generates the first output current according to the phase difference between the reference clock signal and the feedback clock signal.

14 Claims, 10 Drawing Sheets

PHASE-LOCKED LOOP DEVICE

CROSS-REFERENCE TO RELATED APPLICATION

This application claims the priority benefit of China application no. 202211716788.7, filed on Dec. 29, 2022. The entirety of the above-mentioned patent application is hereby incorporated by reference herein and made a part of this specification.

BACKGROUND

Technical Field

The present disclosure relates to a phase-locked loop device, and in particular to a phase-locked loop device that is able to automatically switch on/off a dead zone.

Description of Related Art

In order to solve the problems of sampling or sub-sampling phase-locked loop devices, such as a narrow linear range of a sampling phase detector, occurrences of loss of lock, and a long phase lock time, a variety of solutions have been provided in current technology. One solution is to adopt a frequency-locked loop (FLL) with dead-band control to lock the output frequency of the voltage-controlled oscillator at N times the reference frequency. However, when interference occurs to a loop, the phase of the voltage-controlled oscillator will exceed the linear range of the linear phase detector, and the phase-locked loop device will lose lock. Not until a phase accumulation of the voltage-controlled oscillator exceeds the dead zone range and the current of a charge pump circuit of the frequency-locked loop is turned on and the voltage is adjusted, the phase and frequency of the voltage-controlled oscillator will be pulled back to the locking range of the phase-locked loop. The phase accumulation of this voltage-controlled oscillator is associated with the magnitude of the interference received, so the phase accumulation time might be long, which results in a longer re-locking time of the phase-locked loop.

SUMMARY

This disclosure provides a phase-locked loop device that is able to automatically switch on/off a dead zone and optimize a locking time.

According to an embodiment of the present disclosure, the phase-locked loop device includes a frequency-locked loop circuit and a phase-locked loop circuit. The frequency-locked loop circuit includes a delay generator circuit, a frequency-phase detector, a charge pump circuit, a loop filter, a voltage-controlled oscillator and a frequency divider. The delay generator circuit receives a feedback clock signal, generates a first ramp signal according to the feedback clock signal, and compares the first ramp signal with a plurality of reference voltages to generate a plurality of delayed feedback clock signals. The frequency-phase detector is coupled to the delay generator circuit. The frequency-phase detector has a dead zone control mechanism, generates a locking signal based on comparison between the phases of a reference clock signal and the plurality of delayed feedback clock signals, and selects a charge pump control signal based on the locking signal. A charge pump circuit is coupled to the frequency-phase detector, and generates a second output current according to the charge pump control signal. The charge pump output current is filtered by a loop filter to generate a control voltage that controls the voltage-controlled oscillator. The voltage-controlled oscillator generates an output clock signal based on a control voltage. The frequency divider is coupled to the voltage-controlled oscillator, and divides the frequency of the output clock signal to generate the feedback clock signal. A phase-locked loop circuit is coupled to the frequency divider and generates the first output current according to a phase difference between the reference clock signal and the feedback clock signal.

DESCRIPTION OF THE EMBODIMENTS

Figure 1:
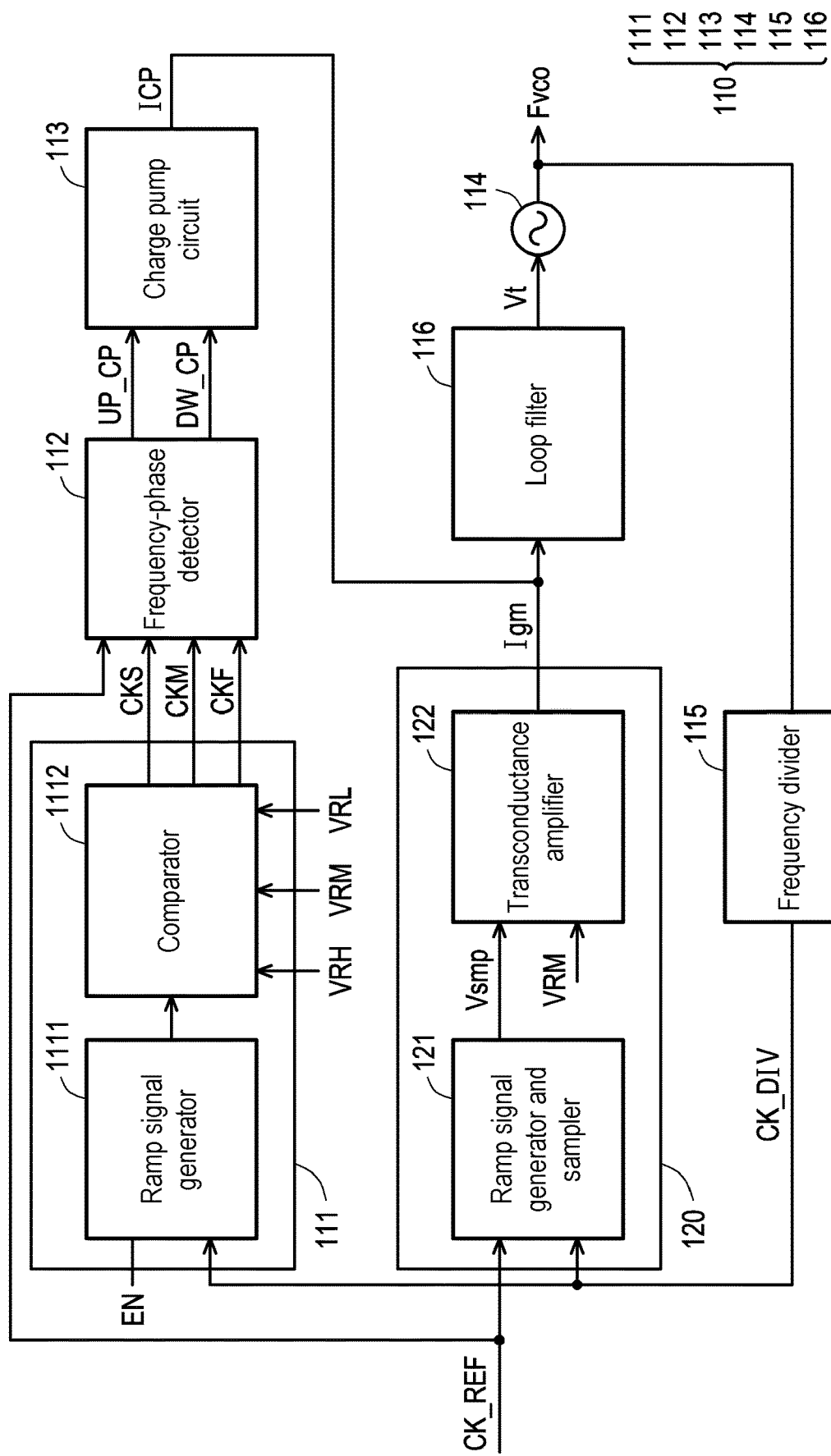
FIG. 1 is a block diagram illustrating a phase-locked loop device according to an embodiment of the present disclosure.

Reference will now be made in detail to the exemplary embodiments of the present disclosure, examples of which are illustrated in the accompanying drawings. Whenever possible, the same reference numbers are adopted in the drawings and descriptions to refer to the same or similar parts.

Please refer to FIG. 1, which is a block diagram illustrating a phase-locked loop device according to an embodiment of the present disclosure. The phase-locked loop device 100 includes a frequency-locked loop circuit 110 and a phase-locked loop circuit 120. The frequency-locked loop circuit 110 includes a delay generator circuit 111, a frequency-phase detector 112 with dead zone detection and control, a charge pump circuit 113, a voltage-controlled oscillator 114, a frequency divider 115 and a loop filter 116, wherein the delay generator circuit 111 includes a ramp signal generator 1111 and a comparator 1112. The ramp signal generator 1111 receives a feedback clock signal CK_DIV and an enable signal EN. In an implementation, the ramp signal generator 1111 may include a linear slope generator. The ramp signal generator 1111 is enabled according to the enable signal EN. The ramp signal generator 1111 generates a ramp signal according to the feedback clock signal CK_DIV. The comparator 1112 is coupled to the ramp signal generator 1111. The comparator 1112 compares the ramp signal with a plurality of reference voltages VRH, VRM, and VRL to generate a plurality of delayed feedback clock signals CKS, CKM, and CKF. In this embodiment, the reference voltages VRH, VRM, and VRL have different voltage values. For example, the reference voltage VRH may be greater than the reference voltage VRM, and the reference voltage VRM may be greater than the reference voltage VRL, wherein the ramp signal generator 111 compares the ramp signal with the reference voltage VRH to generate the delayed feedback clock signal CKS, compares the ramp signal with the reference voltage VRM to generate the delayed feedback clock signal CKM, and compares the ramp signal with the reference voltage VRL to generate the delayed feedback clock signal CKF. In this embodiment, the phase of the delayed feedback clock signal CKF may lead the phase of the delayed feedback clock signal CKM, and the phase of the delayed feedback clock signal CKM may lead the phase of the delayed feedback clock signal CKS.

The frequency-phase detector 112 is coupled to the ramp signal generator 111 and receives the reference clock signal CK_REF. The frequency-phase detector 112 has a dead zone control mechanism. The frequency-phase detector 112 compares the phase of the reference clock signal CK_REF with the phases of the delayed feedback clock signals CKS, CKM, and CKF to generate a locking signal, and selects the charge pump control signals UP_CP and DW_CP according to the locking signal. In this embodiment, when the phase of the reference clock signal CK_REF is between the delayed feedback clock signals CKS and CKF, the locking signal generated by the frequency-phase detector 112 may indicate a locked state. In contrast, when the phase of the reference clock signal CK_REF is leading that of the delayed feedback clock signal CKF, or lagging that of the delayed feedback clock signal CKS, the locking signal generated by the frequency-phase detector 112 may indicate an unlocked state. According to the locking signal, the frequency-phase detector 112 may generate charge pump control signals UP_CP and DW_CP. When the locking signal indicates a locked state, the frequency-phase detector 112 switches on the dead zone to generate the charge pump control signals UP_CP and DW_CP to prevent the charge pump circuit 113 from charging or discharging. When the locking signal indicates an unlocked state, the frequency-phase detector 112 switches off the dead zone to generate the charge pump control signals UP_CP and DW_CP so that the charge pump circuit 113 performs charging or discharging.

The charge pump circuit 113 is coupled to the frequency-phase detector 112 and is provided to generate the output current Icp according to the charge pump control signals UP_CP and DW_CP.

On the other hand, the phase-locked loop circuit 120 includes a ramp signal generator and sampler 121 and a transconductance amplifier 122. The phase-locked loop circuit is coupled to the frequency-locked loop circuit and receives the reference clock signal CK_REF. The transconductance amplifier 122 is coupled to the ramp signal generator and sampler 121. The transconductance amplifier 122 receives the sampling signal Vsmp and the reference voltage VRMand generate the output current Igm according to the sampling signal Vsmp and the reference voltage VRM.

The loop filter 116 is coupled to the charge pump circuit 113 and the transconductance amplifier 122. The loop filter 116 receives the output current Icp and the output current Igm. Through filtering, the loop filter 116 generates an adjusted voltage Vt and provides the adjusted voltage Vt to the voltage-controlled oscillator 114. The voltage-controlled oscillator 114 generates the output clock signal Fvco, and adjusts the frequency of the output clock signal Fvco according to a voltage value of the adjusted voltage Vt. In this embodiment, the output clock signal Fvco may be provided to the frequency divider 115. The frequency divider 115 is coupled to the voltage-controlled oscillator 114 and is provided to divide the frequency of the output clock signal Fvco to generate the feedback clock signal CK_DIV, wherein the frequency divider 115 may be a multi-modulus frequency divider.

It is worth mentioning that in the phase-locked loop device of the present disclosure, the delay generator circuit 111 in the frequency-locked loop circuit 110 performs timing comparison with the reference clock signal CK_REF through multiple delayed feedback clock signals CKS, CKM, and CKF to generate a relative accurate dead zone. In the mean time, it is also possible to assist the phase-locked loop device to lock within a linear range by automatically switching on/off the dead zone. In addition, the ramp signal generator 1111 in the frequency-locked loop circuit 110 may generate a ramp signal with the same slope as the ramp signal generator and sampler 121 in the phase-locked loop circuit 120. Moreover, by detecting the delayed feedback clock signal CKM through the phase-locked loop device, it is possible to know whether the ramp signal generator and sampler 121 in the phase-locked loop circuit 120 are operating in the linear region, and whether the phase-locked loop device is in a locked state.

Figure 2:
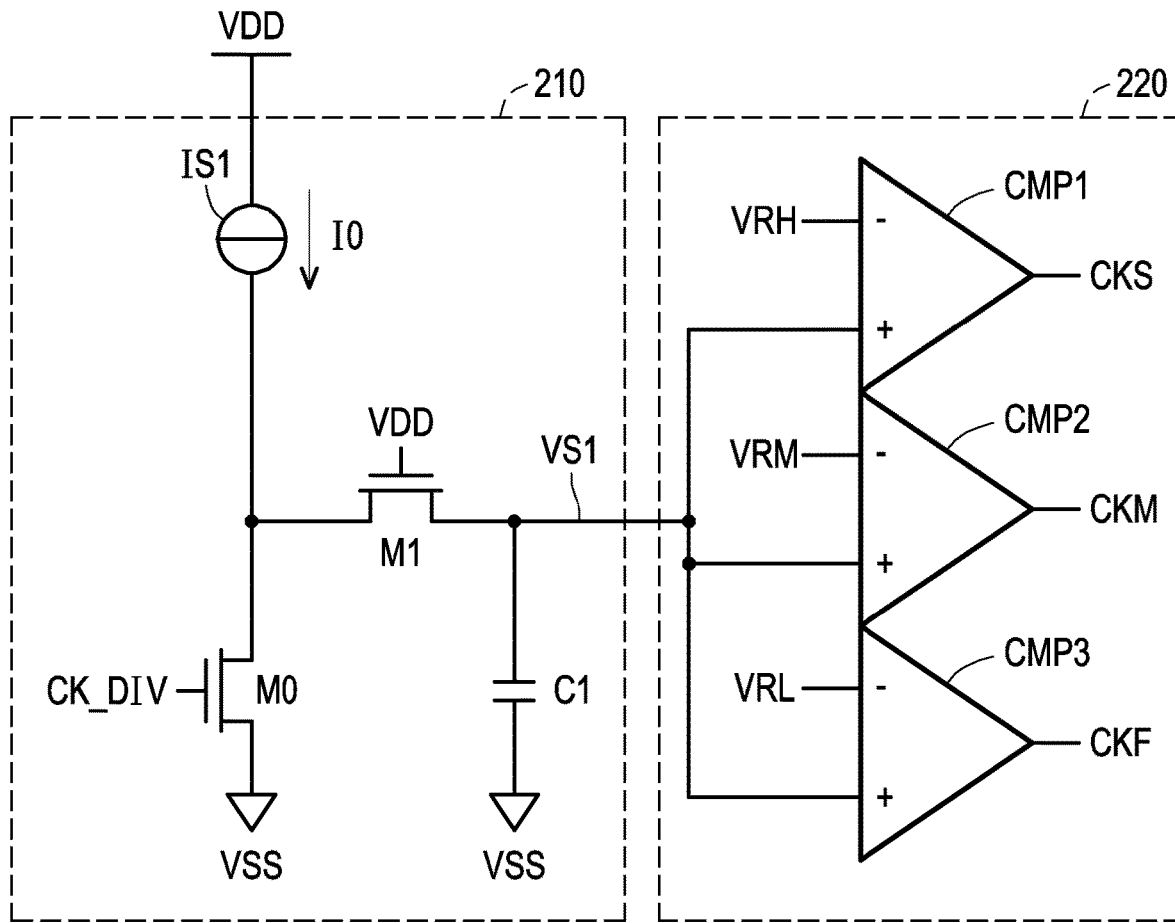
FIG. 2 is a schematic diagram illustrating an implementation of a delay generator circuit in a frequency-locked loop circuit in a phase-locked loop device according to an embodiment of the present disclosure.

As for implementation details, please refer to FIG. 2 first, which is a schematic diagram illustrating an implementation of a delay generator circuit in a frequency-locked loop circuit in a phase-locked loop device according to an embodiment of the present disclosure. The delay generator circuit 200 includes a ramp signal generator 210 and a comparator 220. The ramp signal generator 210 includes transistors M0 and M1, a current source IS1, and a capacitor C1. The current source IS1 receives a power voltage VDD and provides a current I0. A first terminal of the transistor M0 is coupled to the current source IS1 to receive the current I0. A second terminal of the transistor M0 is coupled to a reference ground voltage VSS, and a control terminal of the transistor M0 receives the feedback clock signal CK_DIV. A first terminal of the transistor M1 is coupled to the first terminal of the transistor M0. A second terminal of the transistor M1 is coupled to the first terminal of the capacitor C1 and generates the ramp signal VS1. A control terminal of the transistor M1 receives a set voltage equal to the power voltage VDD. The capacitor C1 is coupled between the second terminal of the transistor M1 and the reference ground voltage VSS.

The comparator 220 includes a plurality of comparison circuits CMP1 to CMP3. The comparison circuits CMP1 to CMP3 may be constructed by operational amplifiers. The positive input terminals of the comparison circuits CMP1 to CMP3 may jointly receive the ramp signal VS1, and the negative input terminals of the comparison circuits CMP1 to CMP3 respectively receive the reference voltages VRH, VRM and VRL. The comparison circuits CMP1 to CMP3 respectively compare the reference voltages VRH, VRM and VRL with the ramp signal VS1 to generate the delayed feedback clock signals CKS, CKM and CKF respectively.

In this embodiment, the transistor M1 may be constantly in an on state. The transistor M0 is controlled by the feedback clock signal CK_DIV, and is turned on when the feedback clock signal CK_DIV is a logic value 1, and is turned off when the feedback clock signal CK_DIV is a logic value 0. When the transistor M0 is turned on, the capacitor C1 may be discharged through the transistors M1 and M0. When the transistor M0 is turned off, the capacitor C1 may receive the current I0 for charging. Through repeated charging and discharging processes, the ramp signal VS1 may be generated at a terminal point at which the capacitor C1 and the transistor M1 are coupled together. The ramp signal VS1 may reflect a phase state of the feedback clock signal CK_DIV.

By comparing the ramp signal VS1 with the reference voltages VRH, VRM, and VRL of different voltage values, on the premise that the reference voltages VRH>VRM>VRL, the phase of the delayed feedback clock signal CKS may be lagging the phase of the delayed feedback clock signal CKM. The phase of the delayed feedback clock signal CKM may be lagging the phase of the delayed feedback clock signal CKF.

Figure 3A:
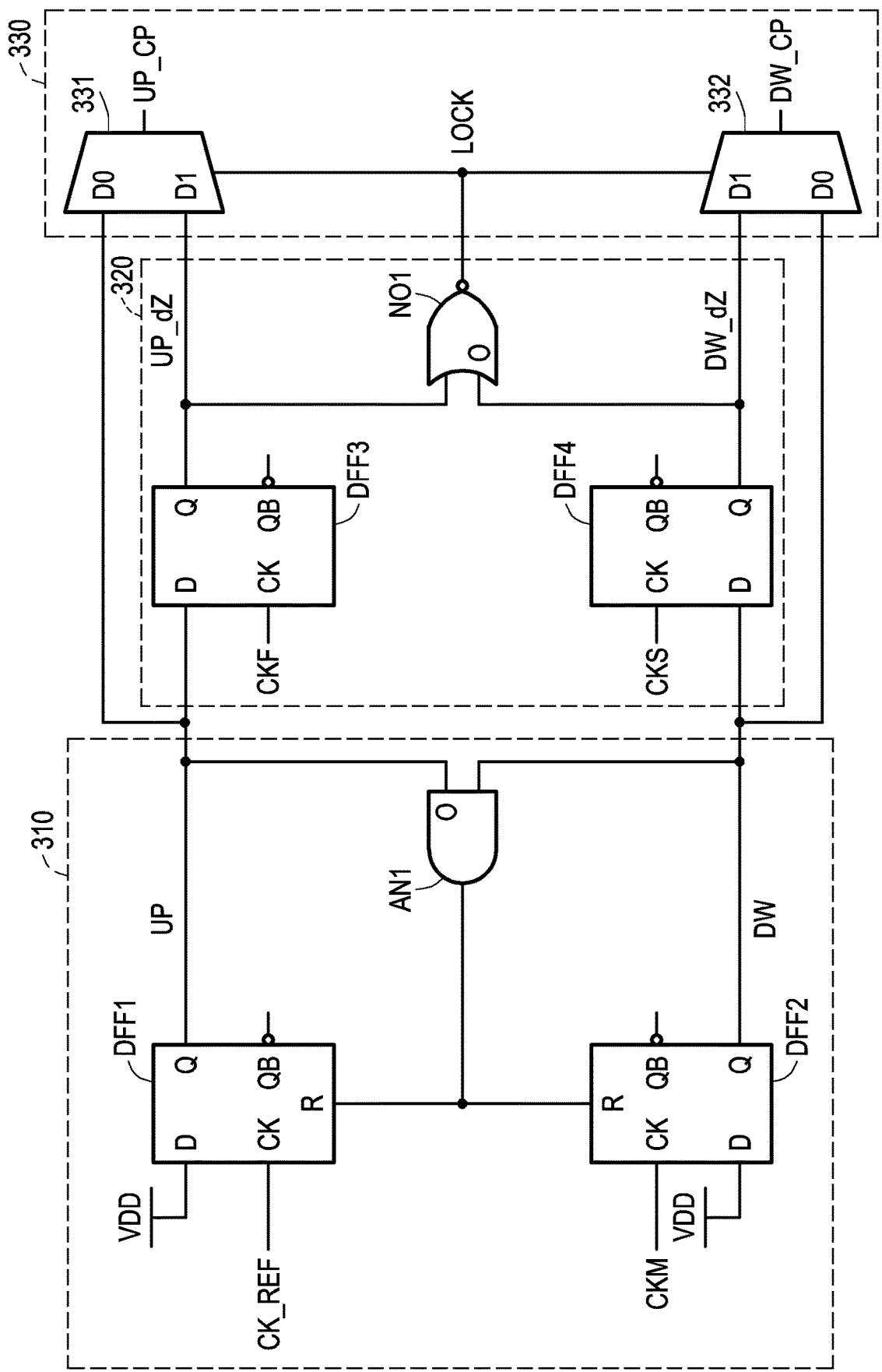
FIG. 3A is a schematic diagram illustrating an implementation of a frequency-phase detector in a frequency-locked loop circuit in a phase-locked loop device according to an embodiment of the present disclosure.

Please refer to FIG. 3A below. FIG. 3A is a schematic diagram illustrating an implementation of a frequency-phase detector in a frequency-locked loop circuit in a phase-locked loop device according to an embodiment of the present disclosure. The frequency-phase detector 300 includes a conventional frequency-phase detection circuit 310, a lock detection and dead zone generator circuit 320, and a dead zone switching circuit 330. The frequency-phase detection circuit 310 generates the first signal UP and the second signal DW according to the phase difference between the reference clock signal CK_REF and the delayed feedback clock signal CKM, wherein the frequency-phase detection circuit 310 includes flip-flops DFF1 and DFF2, as well as an AND gate AN1. The data terminal D of the flip-flop DFF1 receives the power voltage VDD, the clock terminal CK of the flip-flop DFF1 receives the reference clock signal CK_REF, and the output terminal Q of the flip-flop DFF1 generates the first signal UP. The data terminal D of the flip-flop DFF2 receives the power voltage VDD, the clock terminal CK of the flip-flop DFF2 receives the delayed feedback clock signal CKM, and the output terminal Q of the flip-flop DFF2 generates the second signal DW. The AND gate AN1 receives the first signal UP and the second signal DW, and transmits the logical AND operation result of the first signal UP and the second signal DW to the reset terminals R of the flip-flops DFF1 and DFF2. In this embodiment, when the rising edge of the reference clock signal CK_REF occurs, the flip-flop DFF1 may generate the first signal UP which is logic 1. When the rising edge of the delayed feedback clock signal CKM occurs, the flip-flop DFF2 may generate the second signal DW which is logic 1. When the first signal UP and the second signal DW are both logic 1, the flip-flops DFF1 and DFF2 may be reset (making the first signal UP and the second signal DW return to logic 0).

The lock detection and dead zone generator circuit 320 is coupled to the frequency-phase detection circuit 310. The lock detection and dead zone generator circuit 320 samples the first signal UP and the second signal DW respectively according to the delayed feedback clock signal CKF and the delayed feedback clock signal CKS to generate the third signal UP_dZ and the fourth signal DW_dZ respectively. The lock detection and dead zone generator circuit 320 generates the locking signal LOCK according to the third signal UP_dZ and the fourth signal DW_dZ. In detail, the lock detection and dead zone generator circuit 320 includes flip-flops DFF3 and DFF4, as well as an NOR gate NO1. The data terminal D of the flip-flop DFF3 receives the first signal UP, the clock terminal CK of the flip-flop DFF3 receives the delayed feedback clock signal CKF, and the output terminal Q of the flip-flop DFF3 generates the third signal UP_dZ. The data terminal D of the flip-flop DFF4 receives the second signal DW, the clock terminal CK of the flip-flop DFF4 receives the delayed feedback clock signal CKS, and the output terminal Q of the flip-flop DFF4 generates the fourth signal DW_dZ. In addition, the NOR gate NO1 receives the third signal UP_dZ and the fourth signal DW_dZ and generates the locking signal LOCK. When the third signal UP_dZ and the fourth signal DW_dZ are both logic 0, the NOR gate NO1 may generate the locking signal LOCK equal to the logic value 1 and indicate that the phase-locked loop device is in the locked state.

It is worth noting that when the rising edge of the reference clock signal CK_REF is earlier than the rising edge of the delayed feedback clock signal CKF, the flip-flop DFF3 may sample the first signal UP with a logic value of 1 to generate a third signal UP_dZ with a logic value of 1. When the rising edge of the reference clock signal CK_REF is later than the rising edge of the delayed feedback clock signal CKS, the flip-flop DFF4 may sample the second signal DW with a logic value of 1 to generate a fourth signal DW_dZ with a logic value of 1. In contrast, when the rising edge of the reference clock signal CK_REF is between the rising edge of the delayed feedback clock signal CKF and the rising edge of the delayed feedback clock signal CKS, both the third signal UP_dZ and the fourth signal DW_dZ may be logic value 0, and the locking signal LOCK may be equal to the logic value 1.

The dead zone switching circuit 330 is coupled to the lock detection and dead zone generator circuit 320. The dead zone switching circuit 330 selects the first signal UP or the third signal UP_dZ according to the locking signal LOCK to generate the charge pump control signal UP_CP. The dead zone switching circuit 330 selects the second signal DW or the fourth signal DW_dZ according to the locking signal LOCK to generate the charge pump control signal DW_CP. In an embodiment, the dead zone switching circuit 330 includes selectors 331 and 332. The input terminal D0 of the selector 331 receives the first signal UP, and the other input terminal D1 of the selector 331 receives the third signal UP_dZ. When the locking signal LOCK is a logic value of 0, the selector 331 selects the first signal UP as the charge pump control signal UP_CP; when the locking signal LOCK is a logic value of 1, the selector 331 selects the third signal UP_dZ as the charge pump control signal UP_CP.

On the other hand, the input terminal D0 of the selector 332 receives the second signal DW, and the other input terminal D1 of the selector 332 receives the fourth signal DW_dZ. When the locking signal LOCK is a logic value of 0, the selector 332 selects the second signal DW as the charge pump control signal DW_CP; when the locking signal LOCK is a logic value of 1, the selector 332 selects the fourth signal DW_dZ as the charge pump control signal DW_CP.

When the locking signal LOCK is a logic value of 1, the selectors 331 and 332 respectively select the third signal UP_dZ and the fourth signal DW_dZ (both have a logic value of 0) as the charge pump control signal UP_CP and the charge pump control signal DW_CP, and make the charge pump circuit of the subsequent stage inoperative. When the lock signal LOCK is a logic value of 0, the selectors 331 and 332 may respectively select the first signal UP and the second signal DW as the charge pump control signal UP_CP and the charge pump control signal DW_CP, and enable the charge pump circuit of the subsequent stage to perform corresponding charge or discharge action.

Figure 3B:
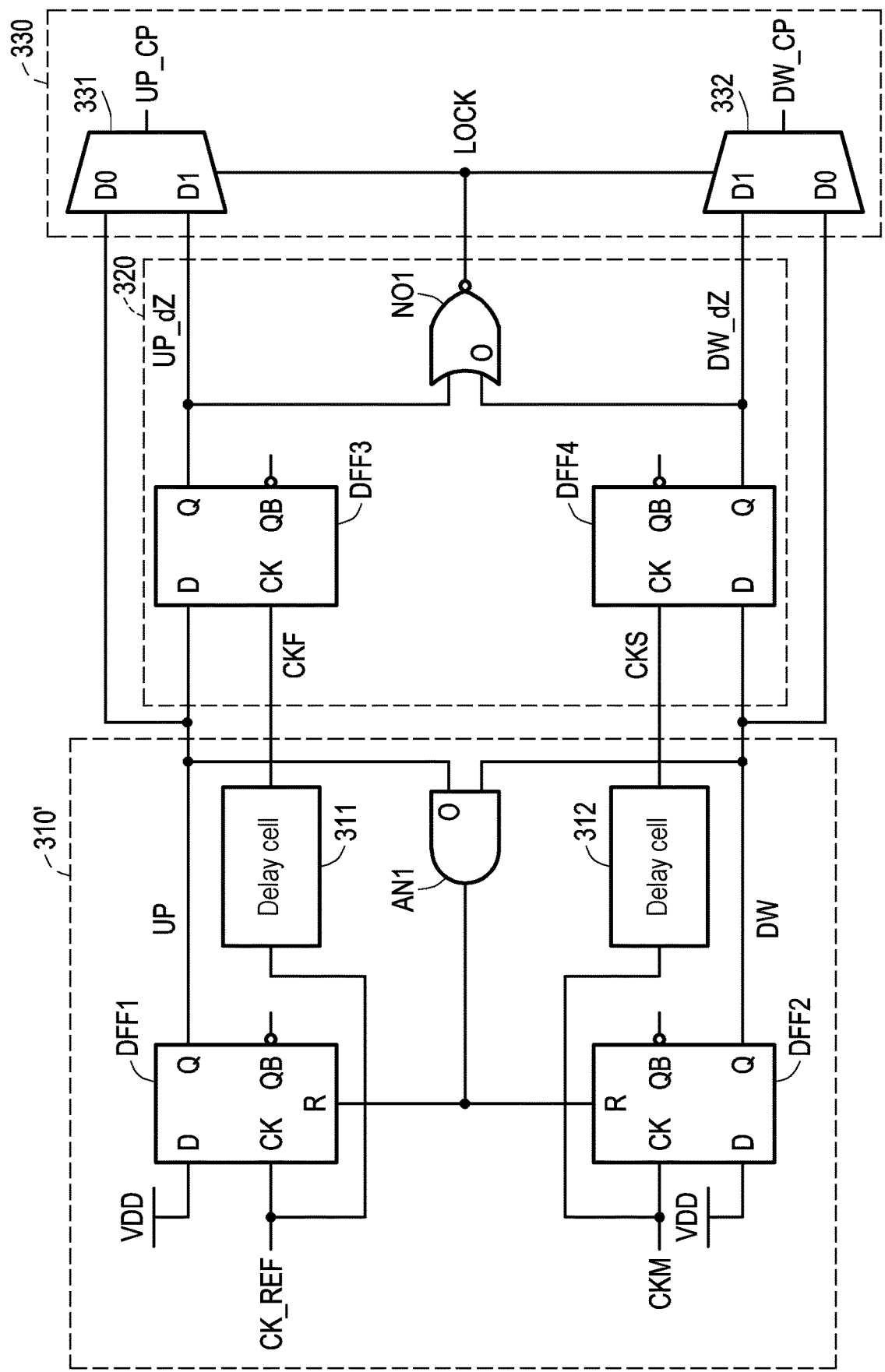
FIG. 3B is a schematic diagram illustrating an implementation of a frequency-phase detector in a frequency-locked loop circuit in a phase-locked loop device according to an embodiment of the present disclosure.

Please refer to FIG. 3B below. FIG. 3B is a schematic diagram illustrating an implementation of a frequency-phase detector in a frequency-locked loop circuit in a phase-locked loop device according to an embodiment of the present disclosure. In FIG. 3B, the frequency-phase detector 300 includes a frequency-phase detection circuit 310', a lock detection and dead zone generator circuit 320, and a dead zone switching circuit 330. Different from FIG. 3A, the frequency-phase detection circuit 310' further includes delay cells 311 and 312. The delay cell 311 receives the reference clock signal CK_REF and generates a delayed feedback clock signal CKF by delaying the reference clock signal CK_REF. The delay cell 312 receives the delayed feedback clock signal CKM and generates the delayed feedback clock signal CKS by delaying the delayed feedback clock signal CKM.

Figure 4A:
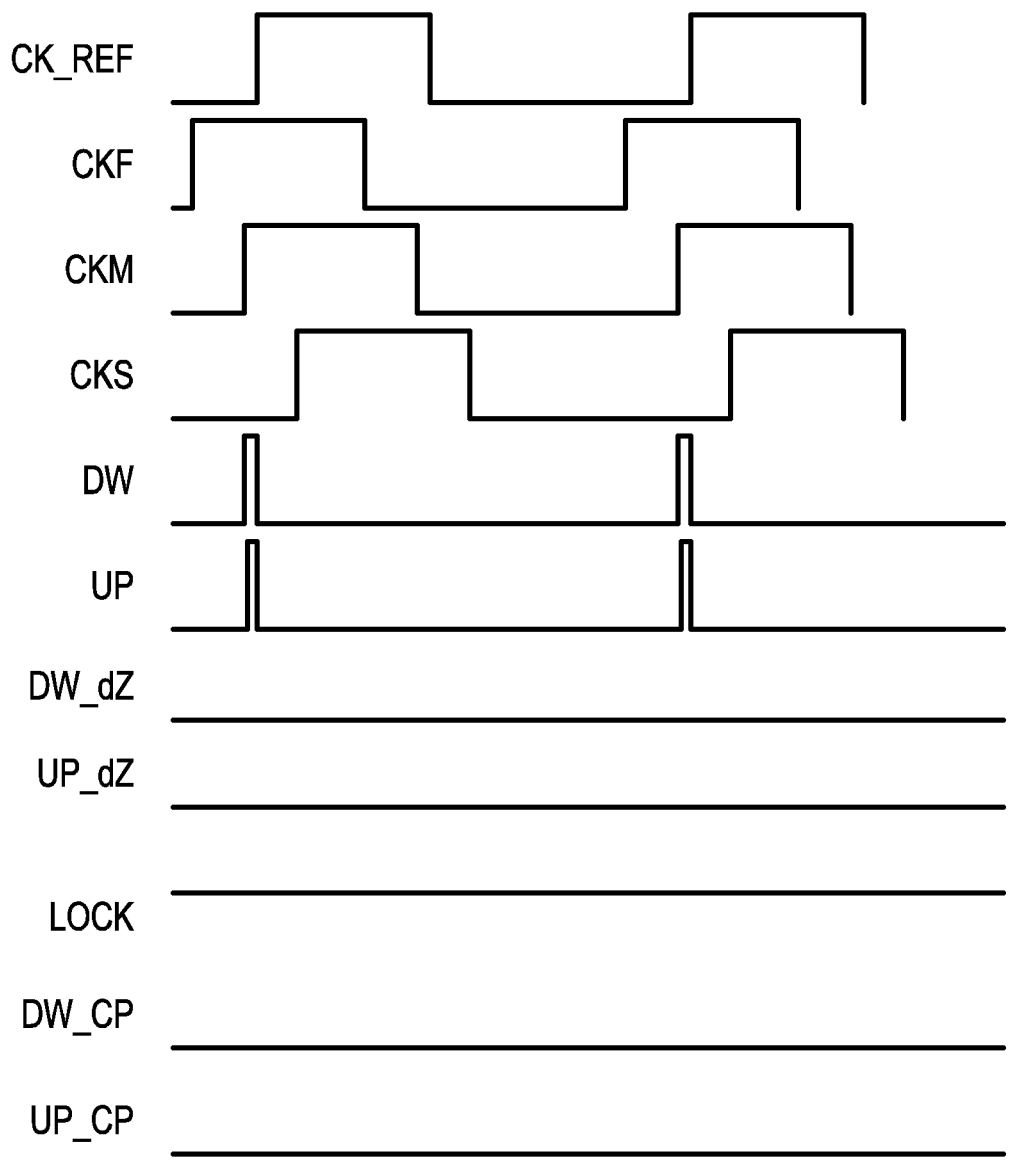
FIG. 4A to FIG. 4C are operation waveform diagrams of the phase-locked loop device according to the embodiment of the present disclosure.
Figure 4B:
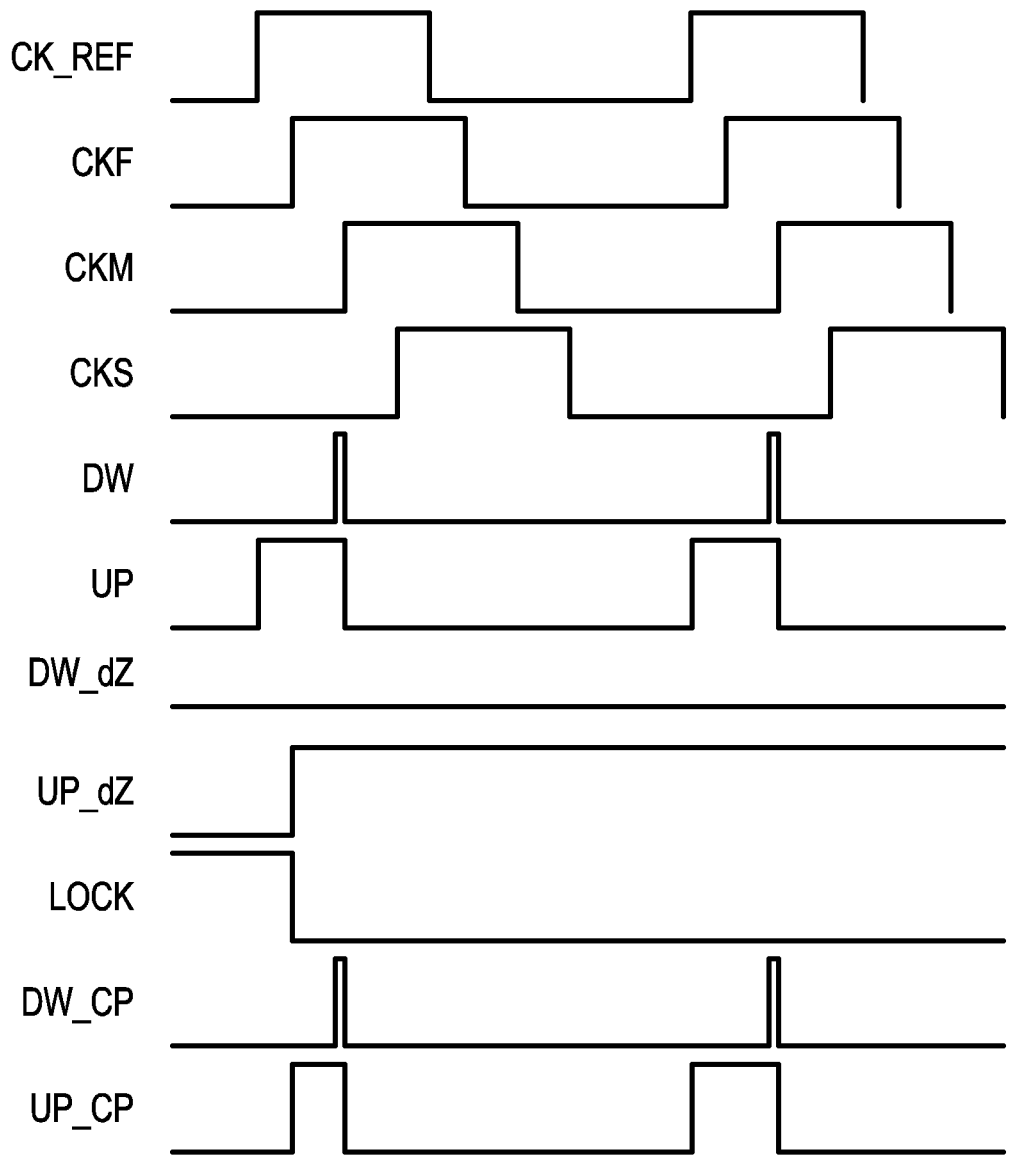
Figure 4C:
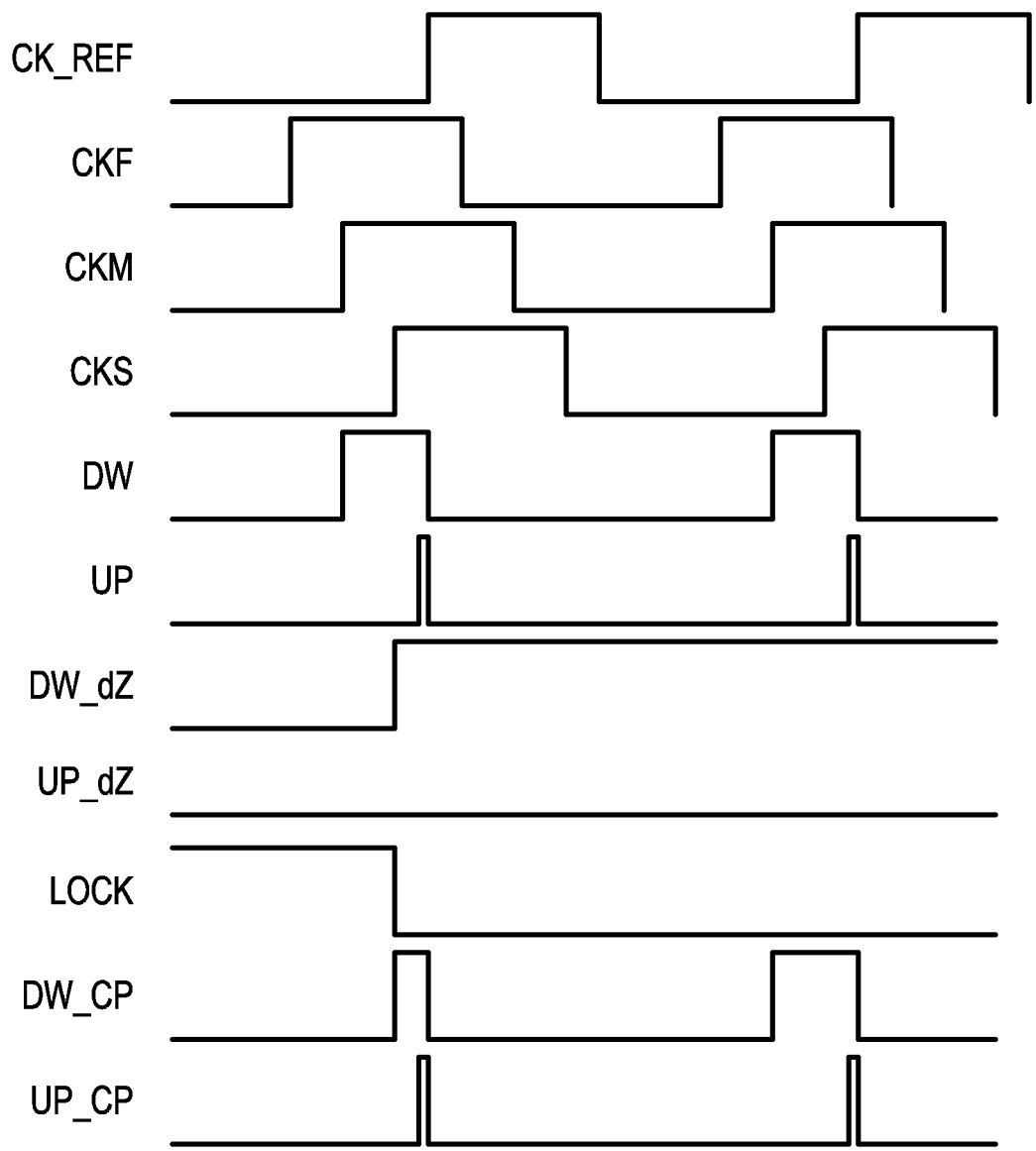

Please refer to FIG. 4A to FIG. 4C below. FIG. 4A to FIG. 4C are operation waveform diagrams of the phase-locked loop device according to an embodiment of the present disclosure, which may correspond to the embodiment of FIG. 3A. In FIG. 4A, when the phase of the reference clock signal CK_REF is between the delayed feedback clock signal CKF and the delayed feedback clock signal CKS, the positive pulse wave of the first signal UP and the positive pulse wave of the second signal DW will not be sampled by the delayed feedback clock signal CKF, and the positive pulse wave of the first signal UP and the positive pulse wave of the second signal DW are reset before the rising edge of the delayed feedback clock signal CKS occurs. Therefore, the positive pulse wave of the first signal UP and the positive pulse wave of the second signal DW are not sampled by the delayed feedback clock signal CKS either. Accordingly, the third signal UP_dZ and the fourth signal DW_dZ may remain equal to the logic value of 0. Correspondingly, the locking signal LOCK is a logic value of 1, and the charge pump control signal UP_CP and the charge pump control signal DW_CP may both be a logic value of 0. In this state, the dead zone is switched on, and the charge pump circuit may not generate the output current subsequently.

In FIG. 4B, when the phase of the reference clock signal CK_REF is leading the phase of the delayed feedback clock signal CKF, the first signal UP may be changed into a logic value of 1 according to the rising edge of the reference clock signal CK_REF, and the flip-flop DFF3 may sample the first signal UP with a logic value of 1 based on the delayed feedback clock signal CKF to generate the third signal UP_dZ with a logic value of 1. Correspondingly, based on the third signal UP_dZ changed to a logic value of 1, the locking signal LOCK is changed to a logic value of 0 and indicates an unlocked state. Based on the locking signal LOCK being a logic value of 0, the dead zone switching circuit 330 may generate the charge pump control signal UP_CP and the charge pump control signal DW_CP with repeated positive pulse waves. In this state, the dead zone is switched off and the charge pump circuit may generate current subsequently to adjust the adjusted voltage received by the voltage-controlled oscillator and correct the frequency and phase of the output clock signal.

Incidentally, when the delayed feedback clock signal CKM is changed to a logic value of 1, the second signal DW generates a positive pulse wave and causes the flip-flops DFF1 and DFF2 to perform a reset state. The first signal UP and the second signal DW are synchronously pulled down to a logic value of 0.

In FIG. 4C, when the phase of the reference clock signal CK_REF is lagging the phase of the delayed feedback clock signal CKS, the second signal DW may be changed to a logic value of 1 according to the rising edge of the delayed feedback clock signal CKM, and the flip-flop DFF4 may sample the second signal DW with a logic value of 1 according to the delayed feedback clock signal CKS to generate a fourth signal DW_dZ with a logic value of 1. Correspondingly, based on the fourth signal DW_dZ changed to a logic value of 1, the locking signal LOCK is changed to a logic value of 0 and indicates an unlocked state. Based on the locking signal LOCK being a logic value of 0, the dead zone switching circuit 330 may generate the charge pump control signal UP_CP and the charge pump control signal DW_CP with repeated positive pulse waves. In this state, the dead zone control mechanism may be turned off, and the charge pump circuit may generate current subsequently to adjust the adjusted voltage received by the voltage-controlled oscillator, and thereby correct the frequency and phase of the output clock signal.

Incidentally, when the reference clock signal CK_REF is changed to a logic value of 1, the first signal UP generates a positive pulse wave and causes the flip-flops DFF1 and DFF2 to perform a reset state. The first signal UP and the second signal DW are synchronously pulled down to a logic value of 0.

Figure 5A:
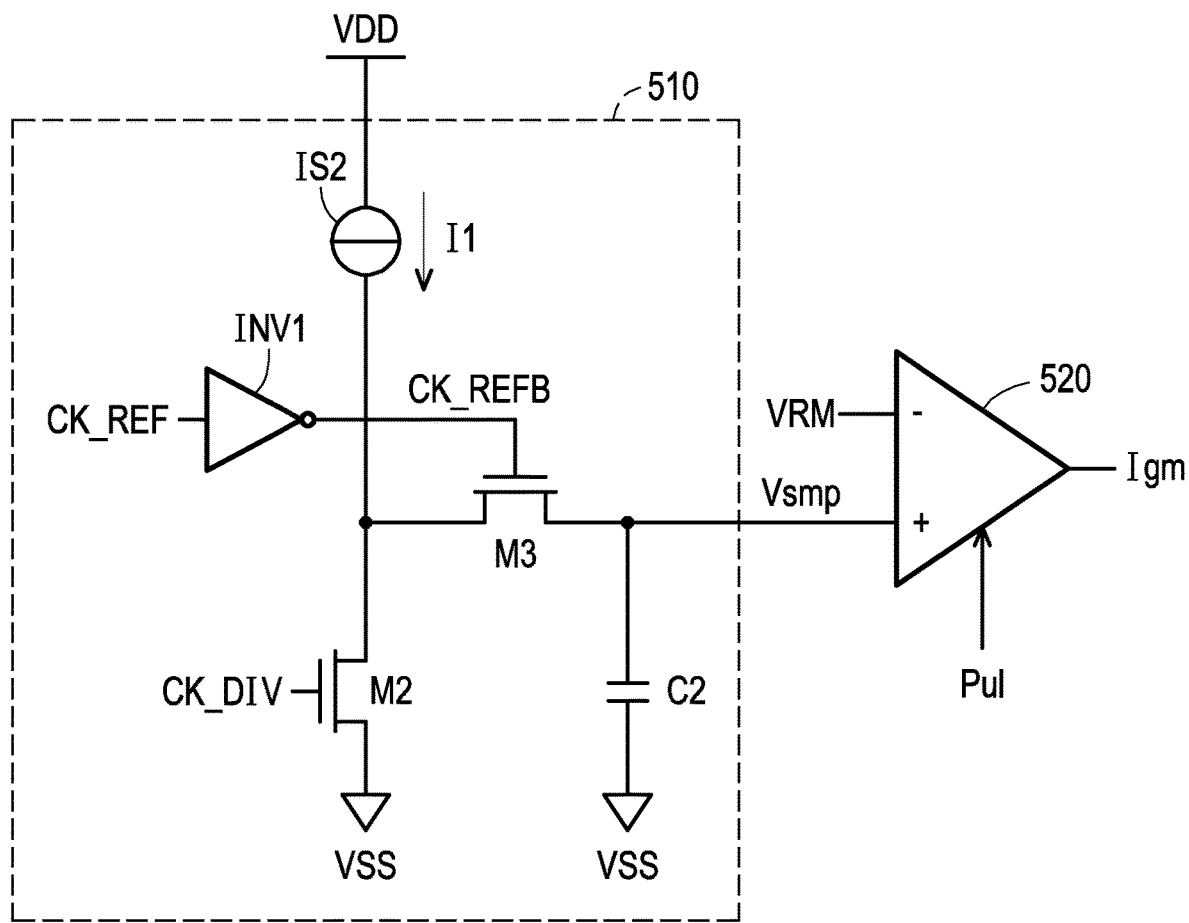
FIG. 5A is a schematic diagram illustrating an implementation of the phase-locked loop circuit in the phase-locked loop device according to an embodiment of the present disclosure.
Figure 5B:
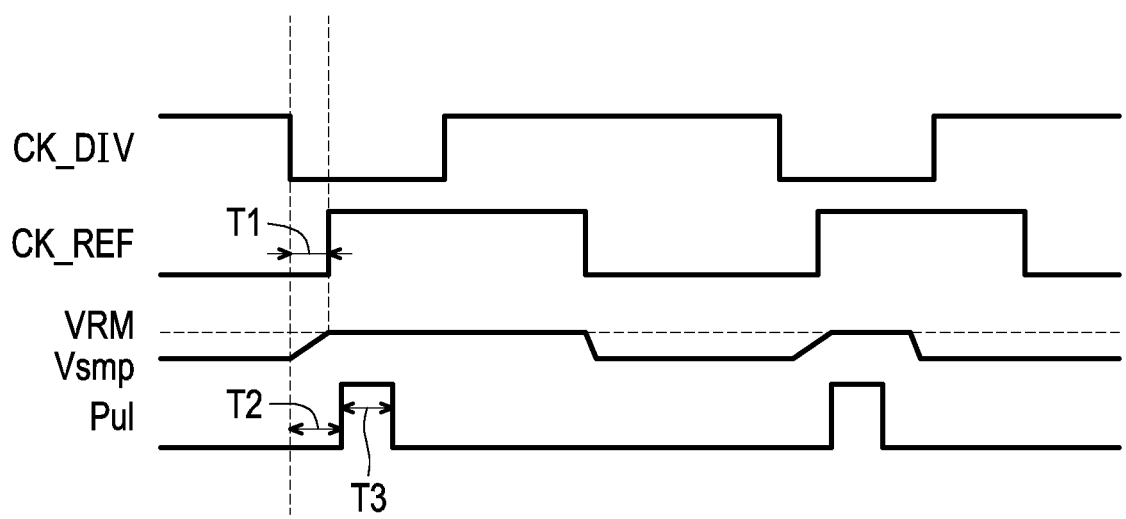
FIG. 5B is an operation waveform diagram of the phase-locked loop circuit according to an embodiment of the present disclosure.

Please refer to FIG. 5A and FIG. 5B below. FIG. 5A is a schematic diagram illustrating an implementation of a phase detection circuit in a phase-locked loop device according to an embodiment of the present disclosure. FIG. 5B is an operation waveform diagram of the phase detection circuit according to an embodiment of the present disclosure. The phase detection circuit 500 includes a ramp signal generator and sampler 510 and a transconductance amplifier 520. In an implementation, the ramp signal generator and sampler 510 may include a linear slope generator and a sampling phase detector. The ramp signal generator and sampler 510 includes a current source IS2, a capacitor C2, an inverter INV1, and transistors M2 and M3. Current source IS2 is configured to provide the current I1. The inverter INV1 receives the reference clock signal CK_REF and generates the inverted reference clock signal CK_REFB. The first terminal of the transistor M2 is coupled to the current source IS2 to receive the current I1; the second terminal of the transistor M2 is coupled to the reference ground voltage VSS; and the control terminal of the transistor M2 receives the feedback clock signal CK_DIV. The first terminal of the transistor M3 is coupled to the first terminal of the transistor M2; the second terminal of the transistor M3 is coupled to the first terminal of the capacitor C2 and generates the sampling signal Vsmp; the control terminal of the transistor M3 receives the inverted reference clock signal CK_REFB.

It is worth mentioning that the circuit assemblies such as the current source IS2, the capacitor C2, and the transistors M2 and M3 in this embodiment may adopt the circuit assemblies respectively having the same specifications as the current source IS1, the capacitor C1, and the transistors M0 and M1 in the embodiment of FIG. 2. That is, the designer may implement the ramp signal generator and sampler 510 by duplicating the ramp generator 210 of the embodiment in FIG. 2.

The transconductance amplifier 520 receives the sampling signal Vsmp and the reference voltage VRM, and generates the output current Igm according to the sampling signal Vsmp, the reference voltage VRM and the control signal Pul.

Please refer to FIG. 5B below, in which the ramp signal generator and sampler 510 detects the phase difference between the feedback clock signal CK_DIV and the reference clock signal CK_REF, and generates the sampling signal Vsmp in a time interval T1 between the falling edge of the feedback clock signal CK_DIV and the rising edge of the reference clock signal CK_REF. On the other hand, the control signal Pul may be pulled high in a time interval T3 after a period of time T2 following the falling edge of the feedback clock signal CK_DIV, and control the transconductance amplifier 520 to output the output current Igm.

The above descriptions are only exemplary embodiments of the present disclosure. In other embodiments, the reference clock signal may be a feedback clock signal, and the feedback clock signal may be a reference clock signal, that is, the reference clock signal CK_REF and the feedback clock signal CK_DIV may be switched to perform delay processing on the reference clock signal CK_REF, and use the feedback clock signal CK_DIV for sampling and comparison.

Figure 6:
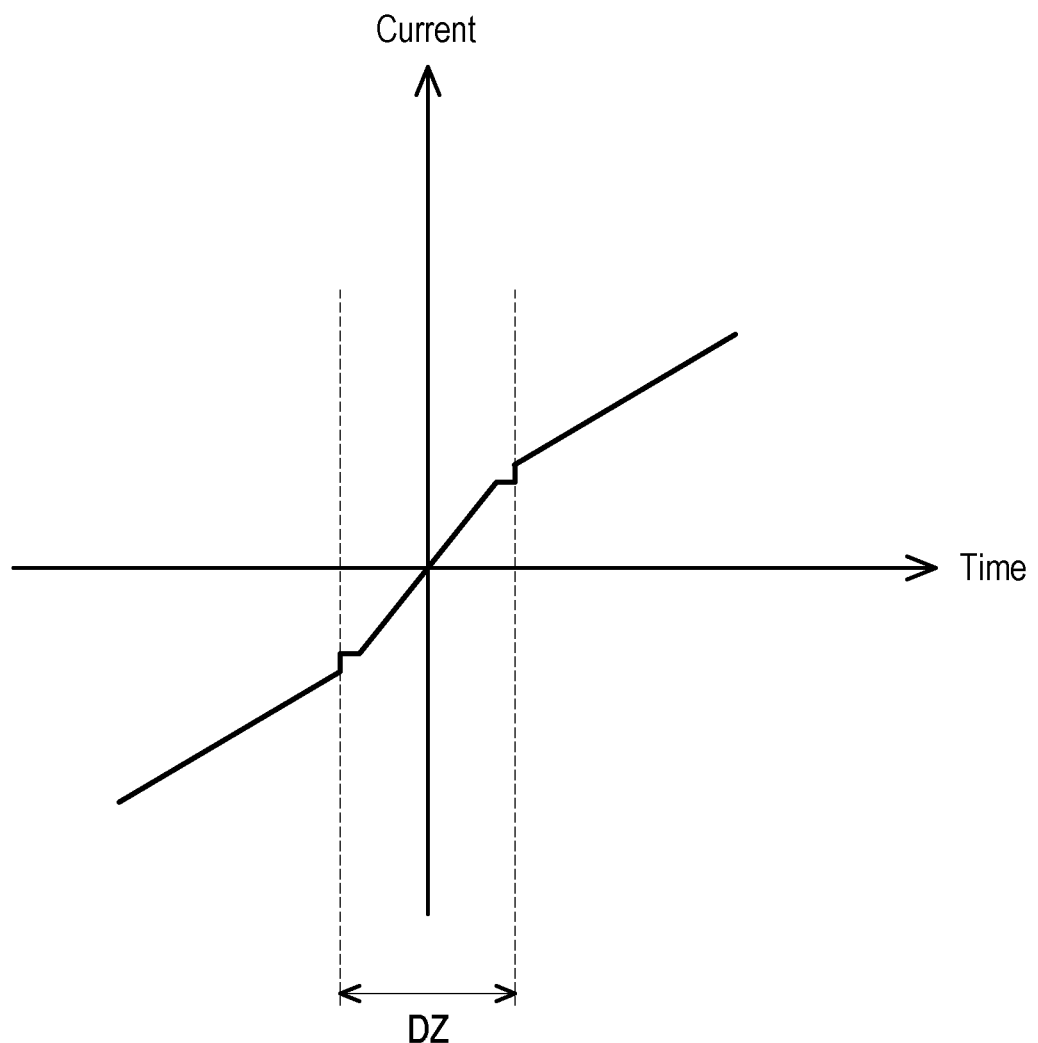
FIG. 6 is a transfer characteristic curve of the phase-locked loop device according to an embodiment of the present disclosure.

Please refer to FIG. 6, which is a transfer characteristic curve of the phase-locked loop device according to an embodiment of the present disclosure. According to the foregoing multiple embodiments and implementations, it may be obtained that in the phase-locked loop device of the embodiment of the present disclosure, when the dead zone control mechanism in the dead zone DZ is activated, the frequency-locked loop circuit in the phase-locked loop device stops the current output action of the charge pump circuit, and the phase-locked loop circuit provides a linear adjustment mechanism to adjust the frequency and phase of the output clock signal by generating a first output current. When the dead zone control mechanism is turned off, the phase-locked loop device adjusts the current output action of the charge pump circuit by switching on the frequency-locked loop circuit. The phase-locked loop circuit operates in a nonlinear region because the ramp signal generator performs the sampling and phase detection action in a limited linear range. The output current Igm no longer changes with the input phase difference, but will output a fixed current to correct the phase. The frequency-locked loop circuit may help speed up the phase adjustment of the voltage-controlled oscillator, so that the sampling phase detector of the phase-locked loop returns to the linear operating range. By switching on/off the dead zone control mechanism, the phase-locked loop device of the embodiment of the present disclosure may improve the linearity of the transfer characteristic curve of the phase-locked loop device and enhance the operation efficiency thereof.

Finally, it should be noted that the above embodiments are only used to illustrate the technical solution of the present disclosure, but not to limit the disclosure. Although the present disclosure has been described in detail with reference to the foregoing embodiments, those of ordinary skill in the art should understand that: the technical solutions described in the foregoing embodiments may still be modified, or some or all of the technical features may be equivalently replaced; and these modifications or replacement do not deviate the essence of the corresponding technical solutions from the scope of the technical solutions to be protected by the embodiments of the present disclosure.

What is claimed is:

1. A phase-locked loop device, comprising:
   a frequency-locked loop circuit, comprising:
      a delay generator circuit, receiving a feedback clock signal, generating a first ramp signal according to the feedback clock signal, and comparing the first ramp signal with a plurality of reference voltages to generate a plurality of delayed feedback clock signals; and
      a frequency-phase detector, coupled to the delay generator circuit and receiving a reference clock signal, the frequency-phase detector having a dead zone control mechanism, generating a locking signal based on a comparison between phases of the reference clock signal and the plurality of delayed feedback clock signals, and automatically switching on/off the dead zone; and
   a phase-locked loop circuit, coupled to the frequency-locked loop circuit and receiving the reference clock signal, and generating a first output current according to a phase difference between the reference clock signal and the feedback clock signal.

2. The phase-locked loop device according to claim 1, wherein the frequency-phase detector selects a plurality of charge pump control signals based on the locking signal.

3. The phase-locked loop device according to claim 2, wherein the frequency-locked loop further comprises:
   a charge pump circuit, coupled to the frequency-phase detector, and generating a second output current according to the plurality of charge pump control signals;
   a loop filter, coupled to the charge pump circuit and the phase-locked loop circuit to filter the first output current and the second output current to generate an adjusted voltage;
   a voltage-controlled oscillator, coupled to the loop filter, generating an output clock signal according to the adjusted voltage; and
   a frequency divider, coupled to the voltage-controlled oscillator, dividing a frequency of the output clock signal to generate the feedback clock signal.

4. The phase-locked loop device according to claim 1, wherein the delay generator circuit comprises:
   a first ramp signal generator, performing charging and discharging operations on a capacitor according to the feedback clock signal to generate the first ramp signal; and
   a comparator, comparing the first ramp signal with the plurality of reference voltages to respectively generate the plurality of delayed feedback clock signals, wherein phases of the plurality of delayed feedback clock signals are different.

5. The phase-locked loop device according to claim 4, wherein the first ramp signal generator comprises:
   a current source, providing a current;
   a first transistor, having a first terminal coupled to the current source to receive the current, a second terminal of the first transistor coupled to a reference ground voltage, and a control terminal of the first transistor receives the feedback clock signal;
   a second transistor, having a first terminal coupled to the first terminal of the first transistor, a second terminal of the second transistor coupled to a first terminal of the capacitor and generating the first ramp signal, a control terminal of the second transistor receiving a set voltage, wherein a second terminal of the capacitor is coupled to a reference ground terminal.

6. The phase-locked loop device according to claim 5, wherein the plurality of reference voltages are a first reference voltage, a second reference voltage and a third reference voltage, the first reference voltage is lower than the second reference voltage, the second reference voltage is lower than the third reference voltage, the plurality of delayed feedback clock signals are a first delayed feedback clock signal, a second delayed feedback clock signal and a third delayed feedback clock signal respectively corresponding to the first reference voltage, the second reference voltage and the third reference voltage, wherein a phase of the first delayed feedback clock signal is leading a phase of the second delayed feedback clock signal, and the phase of the second delayed feedback clock signal is leading a phase of the third delayed feedback clock signal.

7. The phase-locked loop device according to claim 6, wherein the frequency-phase detector comprises:
   a frequency-phase detection circuit, generating a first signal and a second signal according to a phase difference between the reference clock signal and the second delayed feedback clock signal;
   a lock detection and dead zone generator circuit, coupled to the frequency-phase detection circuit, sampling the first signal and the second signal respectively according to the first delayed feedback clock signal and the third delayed feedback clock signal to generate a third signal and a fourth signal respectively, and generating the locking signal according to the third signal and the fourth signal; and
   a dead zone switching circuit, coupled to the lock detection and dead zone generator circuit, selecting the first signal or the third signal to generate a first charge pump control signal according to the locking signal, and selecting the second signal or the fourth signal according to the locking signal to generate a second charge pump control signal.

8. The phase-locked loop device according to claim 7, wherein the frequency-phase detection circuit comprises:
   a first flip-flop, having a data terminal to receive a power voltage, a clock terminal of the first flip-flop receiving the reference clock signal, and an output terminal of the first flip-flop generating the first signal;
   a second flip-flop, having a data terminal to receive the power voltage, a clock terminal of the second flip-flop receiving the second delayed feedback clock signal, and an output terminal of the second flip-flop generating the second signal; and
   an AND gate, receiving the first signal and the second signal, an output terminal of the AND gate coupled to reset terminals of the first flip-flop and the second flip-flop.

9. The phase-locked loop device according to claim 7, wherein the lock detection and dead zone generator circuit comprises:
   a first flip-flop, having a data terminal to receive the first signal, a clock terminal of the first flip-flop receiving the first delayed feedback clock signal, and an output terminal of the first flip-flop generating the third signal;
   a second flip-flop, having a data terminal to receive the second signal, a clock terminal of the second flip-flop receiving the third delayed feedback clock signal, and an output terminal of the second flip-flop generating the fourth signal; and
   an NOR gate, receiving the third signal and the fourth signal and generating the locking signal.

10. The phase-locked loop device according to claim 9, wherein the frequency-phase detection circuit further comprises:
    a first delay cell, receiving the reference clock signal and generating the first delayed feedback clock signal; and
    a second delay cell, receiving the second delayed feedback clock signal and generating the third delayed feedback clock signal.

11. The phase-locked loop device according to claim 7, wherein the dead zone switching circuit comprises:
    a first selector, selecting the first signal or the third signal according to the locking signal to generate a first charge pump control sub-signal; and
    a second selector, selecting the second signal or the fourth signal according to the locking signal to generate a second charge pump control sub-signal.

12. The phase-locked loop device according to claim 1, wherein the phase-locked loop circuit comprises:
    a second ramp signal generator, generating a second ramp signal based on a phase difference between the reference clock signal and the feedback clock signal; and
    a transconductance amplifier, coupled to the second ramp signal generator, receiving the second ramp signal and one of the plurality of reference voltages, and generating the first output current.

13. The phase-locked loop device according to claim 12, wherein the second ramp signal generator and the delay generator circuit have a same circuit architecture.

14. The phase-locked loop device according to claim 10, wherein the second ramp signal generator comprises:
    a current source, providing a current;
    a capacitor;
    an inverter, receiving the reference clock signal and generating an inverted reference clock signal;
    a first transistor, having a first terminal coupled to the current source to receive the current, a second terminal of the first transistor coupled to the reference ground voltage, and a control terminal of the first transistor receiving the feedback clock signal; and
    a second transistor, having a first terminal coupled to a first terminal of the first transistor, a second terminal of the second transistor coupled to a first terminal of the capacitor and generating the second ramp signal, a control terminal of the second transistor receiving the inverted reference clock signal,
    wherein a second terminal of the capacitor is coupled to the reference ground terminal.

* * * * *